US006985992B1

(12) United States Patent
Chang et al.

(10) Patent No.: US 6,985,992 B1
(45) Date of Patent: Jan. 10, 2006

(54) WEAR-LEVELING IN NON-VOLATILE STORAGE SYSTEMS

(75) Inventors: Robert C. Chang, Danville, CA (US); Bahman Qawami, San Jose, CA (US); Farshid Sabet-Sharghi, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 468 days.

(21) Appl. No.: 10/281,739

(22) Filed: Oct. 28, 2002

(51) Int. Cl.
G06F 12/00 (2006.01)
(52) U.S. Cl. ............... 711/103; 711/5; 711/6; 711/154; 711/170; 711/173; 711/202; 365/185.01; 365/185.02; 365/185.29; 365/185.33
(58) Field of Classification Search .......... 365/185.01, 365/185.02, 185.29, 185.33
See application file for complete search history.

(56) References Cited

U.S. PATENT DOCUMENTS

| 5,222,109 A | 6/1993 | Pricer .................. 377/24.1 |
| 5,297,148 A | 3/1994 | Harari et al. .............. 371/10.2 |
| 5,388,083 A | 2/1995 | Assar et al. ................ 365/218 |
| 5,438,573 A | 8/1995 | Mangan et al. ............ 371/10.3 |
| 5,485,595 A | 1/1996 | Assar et al. ................ 395/430 |
| 5,568,423 A | 10/1996 | Jou et al. ................ 365/185.33 |
| 5,568,439 A | 10/1996 | Harari ........................ 365/218 |
| 5,598,370 A | 1/1997 | Niijima et al. ......... 365/185.33 |
| 5,737,742 A * | 4/1998 | Achiwa et al. ............. 711/103 |
| 5,832,493 A | 11/1998 | Marshall et al. ............ 707/101 |
| 5,835,935 A | 11/1998 | Estakhri et al. ............. 711/103 |
| 5,845,313 A | 12/1998 | Estakhri et al. ............. 711/103 |
| 5,860,082 A | 1/1999 | Smith et al. ................. 711/103 |
| 5,907,856 A | 5/1999 | Estakhri et al. ............. 711/103 |
| 5,924,113 A | 7/1999 | Estakhri et al. ............. 711/103 |
| 5,930,193 A | 7/1999 | Achiwa et al. ......... 365/230.03 |
| 5,956,473 A | 9/1999 | Ma et al. |
| 5,963,473 A | 10/1999 | Norman |
| 6,016,275 A | 1/2000 | Han ....................... 365/185.29 |
| 6,081,447 A | 6/2000 | Lofgren et al. ......... 365/185.02 |
| 6,115,785 A | 9/2000 | Estakhri et al. ............. 711/103 |
| 6,125,435 A | 9/2000 | Estakhri et al. ............. 711/201 |

(Continued)

FOREIGN PATENT DOCUMENTS

JP 62-283496 12/1987
JP 62-283497 12/1987

OTHER PUBLICATIONS

Mei-Ling et al., Dec. 2-4, 1997, IEEE, pp. 177-182.*

(Continued)

Primary Examiner—Donald Sparks
Assistant Examiner—Hahem Farrokh
(74) Attorney, Agent, or Firm—Anderson, Levine & Lintel

(57) ABSTRACT

Methods and apparatus for performing wear leveling in a non-volatile memory system are disclosed. According to one aspect of the present invention, a method for allocating non-volatile memory that is divided into elements includes grouping the elements into a first group, a second group, and a third group. The first group includes erased elements with relatively low wear and the second group includes erased elements with relatively high wear. The method also includes determining when a first element included in the third group is to be replaced by a second element included in the first group. Contents of the first element are copied into the second element obtained from the first group. The contents are then erased from the first element, and the second element is associated with the third group. Associating the second element with the third group includes substantially disassociating the second element from the first group.

64 Claims, 8 Drawing Sheets

U.S. PATENT DOCUMENTS

| | | | |
|---|---|---|---|
| 6,226,759 B1 * | 5/2001 | Miller et al. | 714/6 |
| 6,230,233 B1 * | 5/2001 | Lofgren et al. | 711/103 |
| 6,260,156 B1 | 7/2001 | Garvin et al. | 714/8 |
| 6,426,893 B1 | 7/2002 | Conley et al. | 365/185.11 |
| 6,732,221 B2 | 5/2004 | Ban | |

OTHER PUBLICATIONS

Li-Pin et al., Google.*

Kim, Jesung et al., "A Space-Efficient Flash Translation Layer for Compactflash Systems", IEEE Transactions on Consumer Electronics, vol. 48, No. 2, May 2002.

* cited by examiner

WEAR-LEVELING IN NON-VOLATILE STORAGE SYSTEMS

CROSS REFERENCE TO RELATED APPLICATIONS

The present invention is related to co-pending U.S. patent application Ser. No. 10/281,739 entitled "AUTOMATED WEAR LEVELING IN NON-VOLATILE STORAGE SYSTEMS", co-pending U.S. patent application Ser. No. 10/281,670 entitled "TRACKING THE MOST FREQUENTLY ERASED BLOCKS IN NON-VOLATILE MEMORY SYSTEMS", filed Oct. 28, 2002, co-pending U.S. patent application Ser. No. 10/281,824 BLOCKS IN NON-VOLATILE MEMORY SYSTEMS, filed Oct. 28, 2002, co-pending U.S. patent application Ser. No. 10/281,631 entitled "METHOD AND APPARATUS FOR SPLITTING A LOGICAL BLOCK, filed Oct. 28, 2002, co-pending U.S. patent application Ser. No. 10/281,855 entitled "METHOD AND APPARATUS FOR GROUPING PAGES WITHIN A BLOCK," filed Oct. 28, 2002, co-pending U.S. patent application Ser. No. 10/281,762 entitled "METHOD AND APPARATUS FOR RESOLVING PHYSICAL BLOCKS ASSOCIATED WITH A COMMON LOGICAL BLOCK," filed Oct. 28, 2002, U.S. Pat. No. 6,081,447, and U.S. Pat. No. 6,230,233, which are each incorporated herein by reference in their entireties.

BACKGROUND OF THE INVENTION

1. Field of Invention

The present invention relates generally to mass digital data storage systems. More particularly, the present invention relates to systems and methods for allowing the wear associated with storage areas in a non-volatile storage system to be spread out across substantially all storage areas.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

In general, flash memory storage systems may include flash memory cards and flash memory chip sets. Flash memory chip sets generally include flash memory components and a controller components. Typically, a flash memory chip set may be arranged to be assembled into an embedded system. The manufacturers of such assemblies or host systems typically acquire flash memory in component-form, as well as other components, then assemble the flash memory and the other components into a host system.

Although non-volatile memory or, more specifically, flash memory storage blocks within flash memory systems may be repetitively programmed and erased, each block or physical location may only be erased a certain number of times before the block wears out, i.e., before memory begins to become smaller. That is, each block has a program and erase cycle limit. In some memory, a block may be erased up to approximately ten thousand times before the block is considered to be unusable. In other memory, a block may be erased up to approximately one hundred thousand times or even up to a million times before the block is considered to be worn out. When a block is worn out, thereby causing a loss of use or a significant degradation of performance to a portion of the overall storage volume of the flash memory system, a user of the flash memory system may be adversely affected, as for the example through the loss of stored data or the inability to store data.

The wear on blocks, or physical locations, within a flash memory system varies depending upon how much each of the blocks is programmed. If a block or, more generally, a storage element, is programmed once, then effectively never reprogrammed, the number of program and erase cycles and, hence, wear associated with that block will generally be relatively low. However, if a block is repetitively written to and erased, e.g., cycled, the wear associated with that block will generally be relatively high. As logical block addresses (LBAs) are used by hosts, e.g., systems which access or use a flash memory system, to access data stored in a flash memory system, if a host repeatedly uses the same LBAs to write and overwrite data, the same physical locations or blocks within the flash memory system are repeatedly written to and erased, as will be appreciated by those of skill in the art.

When some blocks are effectively worn out while other blocks are relatively unworn, the existence of the worn out blocks generally compromises the overall performance of the flash memory system. In addition to degradation of performance associated with worn out blocks themselves, the overall performance of the flash memory system may be compromised when an insufficient number of blocks which are not worn out are available to store desired data. Often, a flash memory system may be deemed unusable when a critical number worn out blocks are present in the flash memory system, even when many other cells in the flash memory system are relatively unworn. When a flash memory system which includes a substantial number of relatively unworn blocks is considered to be unusable, many resources associated with the flash memory system are effectively wasted.

In order to increase the likelihood that blocks within a flash memory system are worn fairly evenly, wear leveling operations are often performed. Wear leveling operations, as will be understood by those skilled in the art, are generally arranged to allow the physical locations or blocks which are associated with particular LBAs to be changed such that the same LBAs are not always associated with the same physical locations or blocks. By changing the block associations of LBAs, it is less likely that a particular block may wear out well before other blocks wear out.

One conventional wear leveling process involves swapping physical locations to which two relatively large portions of customer or host LBAs are mapped. That is, the LBAs associated with relatively large sections of storage cells are swapped. Such swapping is initiated through a manual command from a customer, e.g., through the use of a host and, as a result, is not transparent to the customer. Also, swapping operations that involve moving data between two relatively large sections of storage cells are time consuming and, hence, inefficient. Additionally, the performance of the overall flash memory system may be adversely affected by swapping operations of a relatively long duration which consume significant resources associated with the overall flash memory system. As will be appreciated by those skilled in the art, moving data from a first location typically involves copying the data into another location and erasing the data from the first location.

Another conventional wear leveling process involves allowing blocks to wear. Once the blocks have effectively worn out, the sectors assigned to the blocks may be reassigned by mapping the addresses associated with the sectors to spare areas once the blocks in which the sectors have been stored have worn out, or have become unusable. As the number of spare areas or blocks is limited and valuable, there may not always be spare areas to which sectors associated with unusable blocks may be mapped. In addition, effectively remapping sectors only after blocks have become unusable generally allows performance of the overall flash memory system to degrade.

Therefore, what are desired are a method and an apparatus for efficiently and substantially transparently performing wear leveling within a flash memory storage system. That is, what is needed is a wear leveling process which promotes more even wear in physical locations associated with the flash memory storage system without requiring a significant use of computational resources.

SUMMARY OF THE INVENTION

The present invention relates to a system and a method for performing wear leveling in a non-volatile memory system. According to one aspect of the present invention, a method for allocating non-volatile memory that is divided into elements includes grouping the elements into a first group, a second group, and a third group. The first group includes elements with relatively low wear and the second group includes elements with relatively high wear. The method also includes determining when a first element included in the third group is to be replaced by a second element included in the first group. Contents associated with the first element are copied into the second element obtained from the first group. The contents of the first element are then erased from the first element, and the second element is associated with the third group. Associating the second element with the third group includes substantially disassociating the second element from the first group. In one embodiment, the elements are grouped based on an erase count associated with each element.

In another embodiment, the first element includes an erase count, and the method includes incrementing the erase count of the first element after erasing the contents from the first element. In such an embodiment, the erase count of the first element may be used to determine whether to associate the first element with the first group, and the method may also include associating the first element with the first group when the erase count of the first element indicates that the first element is to be associated with the first group. Generally, associating the first element with the first group includes disassociating the first element from the third group.

By maintaining elements, e.g., blocks, of a non-volatile memory in groups, or tables, according to the number of times the elements have been erased, the wear of the elements may be managed efficiently. The groups or tables may be used to effectively keep track of the elements or blocks with the most wear and the elements or blocks with the least wear such that such blocks may be readily identified. When a normal block, e.g., a block that contains data contents and is in use, is to be replaced by a block which has been erased less, the replacement block may be efficiently obtained from the group of blocks which have the least wear.

As such, the lifetime of an overall non-volatile memory such as an embedded NAND flash memory, may effectively be increased.

According to another aspect of the present invention, a method for allocating non-volatile memory that are divided into elements includes grouping the elements into at least a first group which includes erased elements with erase counts that are less than an average erase count, a second group which includes erased elements with erase counts that are more than the average erase count, and a third group. A determination is made as to whether the first element included in the third group is to be replaced by a second element included in the second group. Contents associated with the first element are copied into the second element obtained from the second group if the determination is that the first element is to be replaced. The method also includes erasing the contents of the first element from the first element, and associating the second element with the third group. Associating the second element with the third group includes substantially disassociating the second element from the second group. In one embodiment, the method also includes associating the first element with the first group and disassociating the first element from the third group.

In accordance with still another aspect of the present invention, a memory management system that manages an allocation of non-volatile storage elements includes means for maintaining a first data structure that is associated with storage elements which have each been erased substantially less than a particular amount, and means for maintaining a second data structure that is associated with storage elements which have each been erased substantially more than a particular amount. The system also includes means for maintaining a third data structure which generally includes storage elements which are not associated with the first data structure or the second data structure. At least some of the storage elements associated with the third data structure contain data. Means for determining when a first storage element of the third data structure is to be replaced are also included in the system, as are means for associating a second storage element selected from one of the first data structure and the second data structure with the third data structure when it is determined that the first storage element of the third data structure is to be replaced.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Non-volatile memory storage blocks within flash memory storage systems may be repetitively programmed and erased, although each block may generally only be erased a finite number of times before the block wears out. When a block wears out, a relatively significant degradation of performance associated with the portion of the overall storage volume of the flash memory storage system that includes the worn out block occurs, and data stored in that portion may be lost, or it may become impossible to store data in that portion.

In order to increase the likelihood that blocks wear out more evenly within a flash memory storage system, blocks may be more evenly utilized. By keeping track of how many times each block has been erased, as for example through the utilization of an erase count, memory within a system may be more evenly used. An erase count management technique may store an erase count which keeps track of how many times a particular block has been erased in a redundant area associated with the block. Tables may be built in system memory which substantially enables blocks that are in use to effectively be separated from blocks which have relatively high erase counts and blocks which have relatively low erase counts. When a block in use is erased, the block may be "added" to either a table of blocks which have relatively high erase counts or a table of blocks which have relatively low erase counts, as appropriate. Likewise, blocks may be "moved" from either the table of blocks which have relatively high erase counts or the table of blocks which have relatively low erase counts into a block mapping table, i.e., a set of tables of blocks which are in use, to substantially replace any block which has been reassigned from the block mapping table.

By categorizing blocks, blocks may be more evenly utilized as the use of each block may be more effectively managed to even out the wear associated with the blocks. Further, categorizing blocks into tables enables blocks with a low erase count and blocks with a high erase count to be readily identified and, hence, does not utilize a significant amount of computational resources. Hence, wear leveling occurs relatively efficiently. As a result, the life of the flash memory system may be extended substantially without significantly affecting the performance of the flash memory system.

Figure 1A:
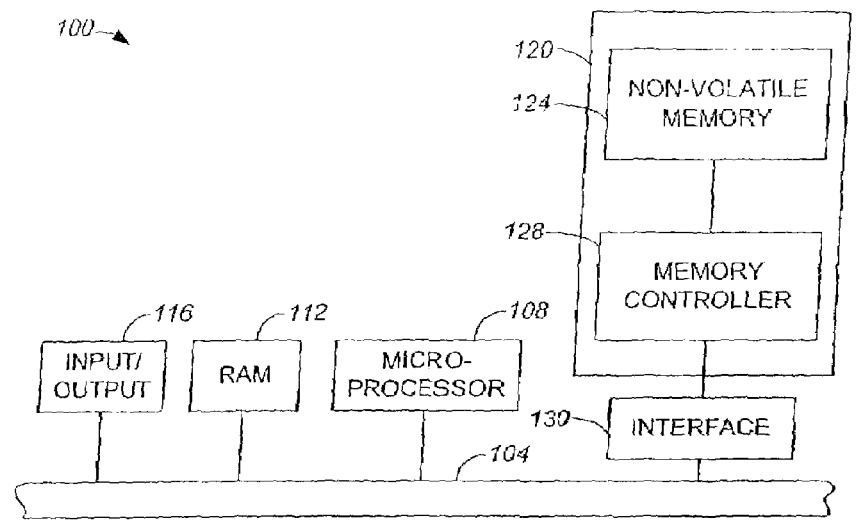
FIG. 1a is a diagrammatic representation of a general host system which includes a non-volatile memory device in accordance with an embodiment of the present invention.

Flash memory systems or, more generally, non-volatile memory devices generally include flash memory cards and chip sets. Typically, flash memory systems are used in conjunction with a host system such that the host system may write data to or read data from the flash memory systems. However, some flash memory systems include embedded flash memory and software which executes on a host to substantially act as a controller for the embedded flash memory. Referring initially to FIG. 1a, a general host system which includes a non-volatile memory device, e.g., a CompactFlash memory card or an embedded system, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, or a video player. It should be appreciated, however, that host system 100 may generally be substantially any system which stores data or information, and retrieves data or information.

It should be appreciated that host system 100 may also be a system which either only captures data, or only retrieves data. That is, host system 100 may be a dedicated system which stores data, or host system 100 may be a dedicated system which reads data. By way of example, host system 100 may be a memory writer which is arranged only to write or store data. Alternatively, host system 100 may be a device such as an MP3 player which is typically arranged to read or retrieve data, and not to capture data.

A non-volatile memory device 120 which, in one embodiment, is a removable non-volatile memory device, is arranged to interface with bus 104 to store information. An optional input/output circuit block 130 may allow non-volatile memory device 120 to interface indirectly with bus 104. When present, input/output circuit block 132 serves to reduce loading on bus 104, as will be understood by those skilled in the art. Non-volatile memory device 120 includes non-volatile memory 124 and an optional memory control system 128. In one embodiment, non-volatile memory device 120 may be implemented on a single chip or a die. Alternatively, non-volatile memory device 120 may be implemented on a multi-chip module, or on multiple discrete components which may form a chip set and may be used together as non-volatile memory device 120. One embodiment of non-volatile memory device 120 will be described below in more detail with respect to FIG. 1b.

Non-volatile memory 124, e.g., flash memory such as NAND flash memory, is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128 or, when memory control system 128 is not present, by software executed by microprocessor 108. The operation of non-volatile memory 124 may be managed such that the lifetime of non-volatile memory 124 is substantially maximized by essentially causing sections of non-volatile memory 124 to be worn out substantially equally.

Non-volatile memory device 120 has generally been described as including an optional memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and Secure Digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art. Alternatively, the functionality of memory control system 128 may be provided by microprocessor 108, as for example in an embodiment in which non-volatile memory device 120 does not include memory controller 128, as discussed above.

Figure 1B:
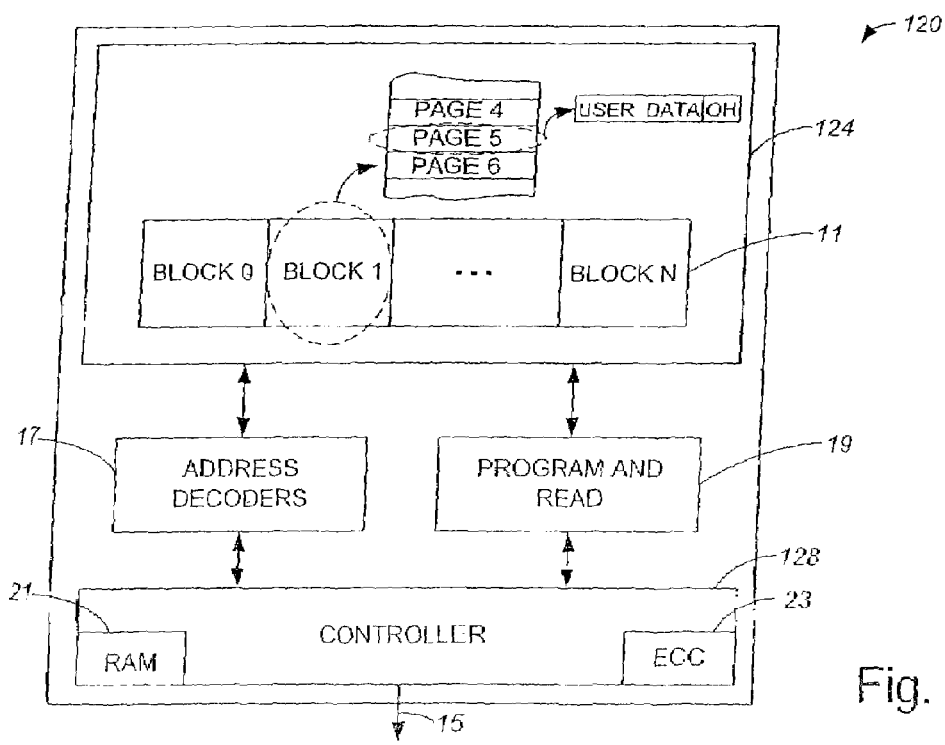
FIG. 1b is a diagrammatic representation a memory device, e.g., memory device 120 of FIG. 1a, in accordance with an embodiment of the present invention.

With reference to FIG. 1b, non-volatile memory device 120 will be described in more detail in accordance with an embodiment of the present invention. As described above, non-volatile memory device 120 includes non-volatile memory 124 and may include memory control system 128. Memory 124 and control system 128, or controller, may be primary components of non-volatile memory device 120, although when memory 124 is an embedded NAND device, for example, non-volatile memory device 120 may not include control system 128. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

When present, control system 128 communicates over a bus 15 to a host computer or other system that is using the memory system to store data. Bus 15 is generally a part of bus 104 of FIG. 1. Control system 128 also controls operation of memory 124, which may include a memory cell array 11, to write data provided by the host, read data requested by the host and perform various housekeeping functions in operating memory 124. Control system 128 generally includes a general purpose microprocessor which has associated non-volatile software memory, various logic circuits, and the like. One or more state machines are often also included for controlling the performance of specific routines.

Memory cell array 11 is typically addressed by control system 128 or microprocessor 108 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Figure 2:
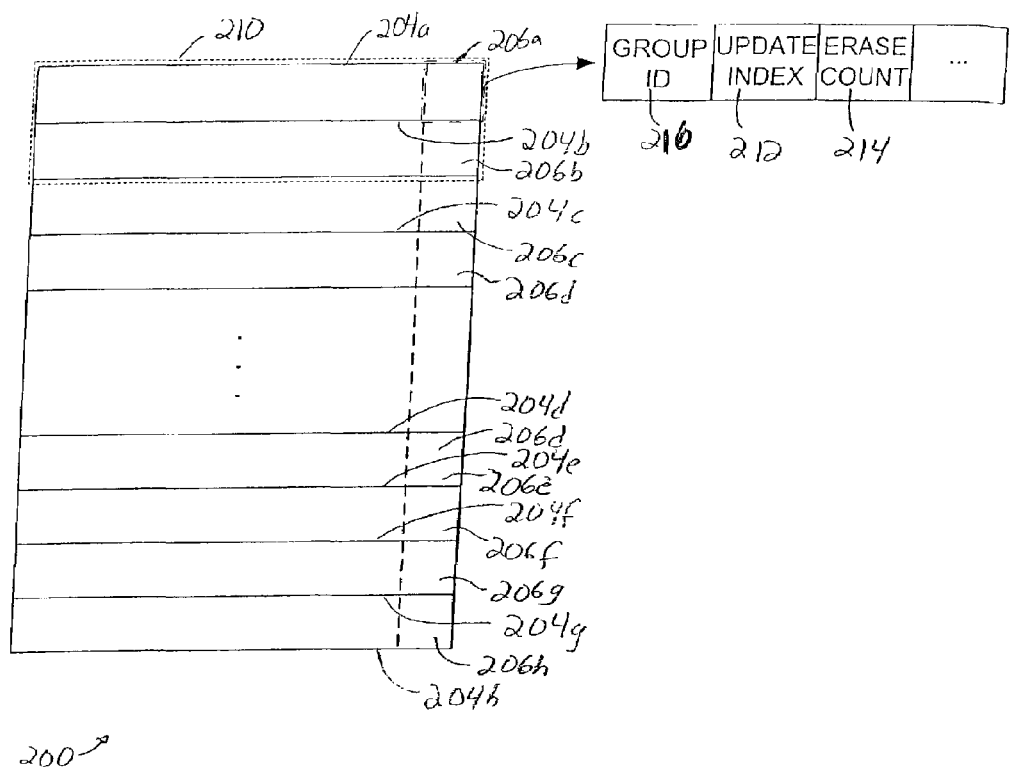
FIG. 2 is a diagrammatic representation of a portion of a flash memory in accordance with an embodiment of the present invention.

Array 11 is divided into a large number of BLOCKS 0—N memory cells. As is common for flash EEPROM systems, the block is typically the smallest unit of erase. That is, each block contains the minimum number of memory cells that are erased together. Each block is typically divided into a number of pages, as also illustrated in FIG. 2. A page is typically the smallest unit of programming. That is, a basic programming operation writes data into or reads data from a minimum of one page of memory cells. One or more sectors of data are typically stored within each page. As shown in FIG. 1b, one sector includes user data and overhead data. Overhead data typically includes an error correction code (ECC) that has been calculated from the user data of the sector. A portion 23 of the control system 128 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data is typically an additional 16 bytes. One sector of data is most commonly included in each page but two or more sectors may instead form a page. Any number of pages may generally form a block. By way of example, a block may be formed from eight pages up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

When a particular section, e.g., storage element, of non-volatile memory 124 is programmed continuously, e.g., written to and erased repeatedly, that particular area generally wears out more quickly than an area which is not programmed continuously. In order to effectively "even out" the wear of different areas within non-volatile memory 124, wear leveling may be substantially automatically performed such that areas which are programmed continuously are programmed less, while areas that are not programmed continuously may be programmed more.

Generally, to perform wear leveling, a block, e.g., a set of sectors which are associated with a physical location, which is programmed repeatedly may be swapped with a block which is associated with a physical location which is not programmed repeatedly. That is, a physical block which has been programmed and, hence, erased repeatedly may be swapped with a physical block which has been programmed and erased less often.

In one embodiment of the present invention, in order for it to be readily determined whether a particular physical block has been programmed and erased repeatedly, an erase count may be stored with the block. That is, a counter which keeps track of how many times a block has been erased may be maintained and incremented each time the block is erased. Such an erase count may be used to facilitate a determination of whether a particular block should be swapped with another block which has been erased less often. FIG. 2 is a diagrammatic representation of a portion of a flash memory in accordance with an embodiment of the present invention. Flash memory 200 may be divided into pages 204. Each page 204, which generally contains approximately 512 bytes of user data, effectively includes a redundant area 206, e.g., page 204*a* includes redundant area 206*a*. Each redundant area 206 or overhead area may include up to approximately sixteen bytes of information which typically includes, but is not limited to, a group identifier 216, an update index 212, and an erase count 214.

Typically, any number of pages 204 are included in a block 210. For ease of illustration, pages 204*a*, 204*b* are shown as being included in block 210, although it should be appreciated that the number of pages 204 included in block 210 may vary widely. In the described embodiment, block 210 may be arranged to include approximately 32 pages. For example, when flash memory 200 includes approximately 512 Megabits (Mb), flash memory 200 may effectively be divided into approximately 4096 blocks of 32 pages each.

As previously mentioned, erase count 214 may be incremented each time user data is erased from an associated block. For instance, erase count 214, which is associated with block 210, may be incremented each time data is erased from block 210. Since each page 204*a*, 204*b* included in block 210 generally has an erase count 214, the erase count 214 associated with each page 204*a*, 204*b* may be incremented when block 210 is erased.

In general, when a block containing data is erased, both the data areas and the redundant areas of the block are erased or emptied. The erased block is typically added to a spare block pool, which contains the erased blocks with smaller erase counts than those of other erased blocks, e.g., erased blocks of other tables. The spare block table may essentially be the least frequently erased block table, which will be described below. In one embodiment of the present invention, an erased block which has large erase count is added to the pool containing the erased blocks containing larger erase count comparing to erased blocks of other tables. The pool which contains erased blocks with large erase counts may be a most frequently erased block table, which will also be described below. The erase count of a just erased block is incremented by one and is saved in either the least frequently erased block table or the most frequently erased block table depending on the value of the count.

Figure 3:
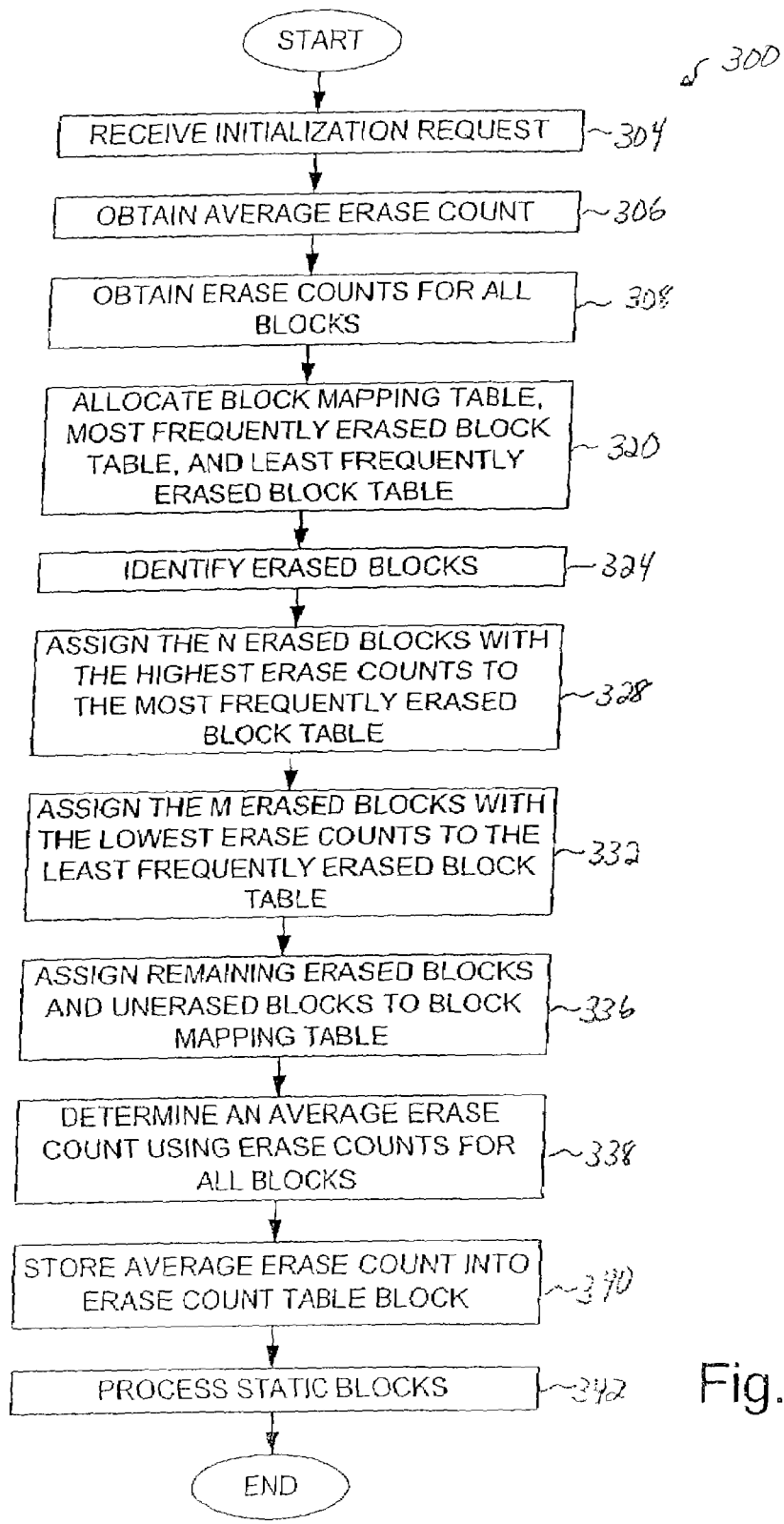
FIG. 3 is a process flow diagram which illustrates the steps associated with processing an initialization request with respect to a flash memory system, in accordance with an embodiment of the present invention.

Returning to FIG. 2, an erase count such as erase count 214 may be accessed during an initialization request. An initialization request may be made, for example, when a system, e.g., a system which includes embedded flash memory, is powered up, when spare blocks within a system are running low, when a user makes a request to balance block allocation, and when a user makes a request for block usage to occur more evenly. FIG. 3 is a process flow diagram which illustrates the steps associated with processing an initialization request with respect to a flash memory system, in accordance with an embodiment of the present invention. In general, an initialization request may either be initiated by a user or substantially automatically initiated by a controller associated with flash memory system, e.g., periodically or when a triggering condition is met. A process 300 of responding to an initialization request begins at step 304 in which an initialization request is effectively received. An initialization request may be received by a controller or a processor which is in communication with flash memory which is to be initialized. Such a request may be provided by a user via a host at power up, or when block allocation is to be balanced, for example.

Once the initialization request is received, an average erase count is obtained in step 306. In one embodiment, the average erase count is stored in an erase count block which is written into NAND memory associated with the system. The erase count block (ECB) containing the average erase count and the erase count of each block is stored in a block of the flash memory. It should be appreciated that when an erase count block is created, e.g., when the system is initially formatted, the average erase count and the erase count of each block in the table is typically initialized to a value of zero. After the average erase count is obtained, erase counts for substantially all blocks within the system are obtained. As described above with respect to FIG. 2, the erase count for a particular block containing data may be stored in a redundant area that is associated with that block. Hence, obtaining the erase count for substantially all blocks containing data may include accessing a redundant area associated with each block, and storing each erase count into the erase count block.

At an initialization request, the erase count of an erased block is obtained from an erase count block. The erase count block generally retains its value because the redundant area of that block is erased. When the overall system is shut down, a termination request is typically made so the erase count table is updated to contain the latest erase count of substantially all blocks. At any given time, a block belongs in a most frequently erased block table, a least frequently erased block table, an erase count block, or in a block mapping table. The erase count of a block that belongs to an erase count block is stored in a redundant area of the block. The erase count of a block that contains data often belongs to a block mapping table and is stored in the redundant area. The erase count of an erased block that belongs to a block mapping table has a zero erase count because the block has effectively never been used. Obtaining erase counts from blocks in a least frequently erased block table or a most frequently erased block table involves getting the value from the table since each entry of the tables generally contains both the block number of an erased block and its erase count. Upon the completion of the processing of an initialization request, the erase count block is generally updated with the current erase count of all blocks.

In step 320, a block mapping table is allocated in the system memory, e.g., the host system memory. As will be appreciated by those skilled in the art, a block mapping table may be arranged to provide a mapping between a logical block address (LBA) and a physical block address (PBA). Additionally, a most frequently erased block table and a least frequently erased block table are also allocated in step 320.

A most frequently erased block table is typically sized or otherwise configured to effectively hold information relating to erased blocks which have been erased most frequently. That is, a most frequently erased block is arranged to hold information, e.g., erase counts and mapping information, pertaining to erased blocks with the highest erase counts in the system. Similarly, a least frequently erased block table is generally sized or otherwise configured to accommodate information pertaining to erased blocks with the lowest erase counts. Although the size of the most frequently erased block table and the size of the least frequently erased block table may vary widely, the sizes are dependent upon the number of blocks which are to be designated as most frequently erased and the number of blocks which are to be designated as least frequently erased. Typically, the most frequently erased block table is generally sized to accommodate information for fewer erased blocks than the least frequently erased block table. By way of example, the most frequently erased block table may be sized to accommodate information for approximately eighteen erased blocks, while the least frequently erased block table may be sized to accommodate information relating to approximately seventy erased blocks. Alternatively, the most frequently erased block table may be sized to accommodate information for approximately ten erased blocks, while the least frequently erased block table may be sized to accommodate information for approximately fifty erased blocks. After tables are allocated in step 320, erased blocks are identified in step 324.

Then, in step 328, "N" erased blocks may be assigned to the most frequently erased blocks and essentially be assigned to the most frequently erased table. In one embodiment, the "N" erased blocks may be the "N" erased blocks with the highest erase counts as determined by a comparison of all erase counts. Alternatively, the "N" erased blocks to store in the most frequently erased block table may be determined based upon a comparison against the average erase count obtained in step 306. For instance, the "N" erased blocks may be "N" erased blocks which have an erase count that is at least a given percentage, e.g., approximately twenty-five percent, higher than the average erase count.

Once the most frequently erased block table is effectively populated, "M" erased blocks may be identified and effectively be assigned to the least frequently erased block table in step 332. The "M" erased blocks may generally be the "M" erased blocks with the lowest erase counts of all erased blocks associated with the system, or the "M" erased blocks may be "M" erased blocks which have an erase count that is at least a given percentage lower than the average erase count. The "M" erased blocks are effectively spare blocks which will be assigned to the block mapping table as appropriate.

Remaining erased blocks, i.e., erased blocks which have not be assigned to either the least frequently erased block table or the most frequently erased block table, are assigned to the block mapping table along with "unerased" blocks in step 336. In other words, remaining erased blocks as well as blocks containing data other than in associated redundant areas are associated with the block mapping table.

After the block mapping table, the least frequently erased block table, and the most frequently erased block table are effectively populated, e.g., with erase counts and mapping information pertaining to corresponding blocks, an average erase count may be determined in step 338. Determining the average erase count typically involves summing the erase counts of individual blocks which were obtained in step 308, and dividing the sum by the total number of blocks.

The average erase count calculated in step 338 is stored into the erase count block associated with the system. As previously mentioned, the average erase count is stored in an erase count block which is written into NAND memory associated with the system. Upon storing the average erase count into the erase count block, static blocks, or blocks which contain data and have a relatively low associated erase count, may be processed in step 342. The steps associated with one method of processing a static block will be described below with respect to FIG. 4. Once the static blocks are processed, the process of processing an initialization request is completed.

Within a group of blocks associated with a flash memory, there are usually blocks which are erased and blocks which contain data, i.e., user data, at any given time. Some of the blocks which contain data may be considered to be "normal" blocks, while others may be considered to be static blocks. Static blocks are blocks that contain data which is rarely changed. In other words, static blocks are rarely erased. Typically, static blocks may be associated with relatively old documents stored in flash memory, an executable program stored in the flash memory, or an operating system stored in the flash memory. A static block may generally have an erase count that is substantially lower than the erase count of the majority of blocks within flash memory. In one embodiment, a block which contains data may be considered to be a static block if the erase count of the block is below a certain percentage, e.g., approximately twenty percent, of the average erase count associated with a flash memory system.

Figure 4:
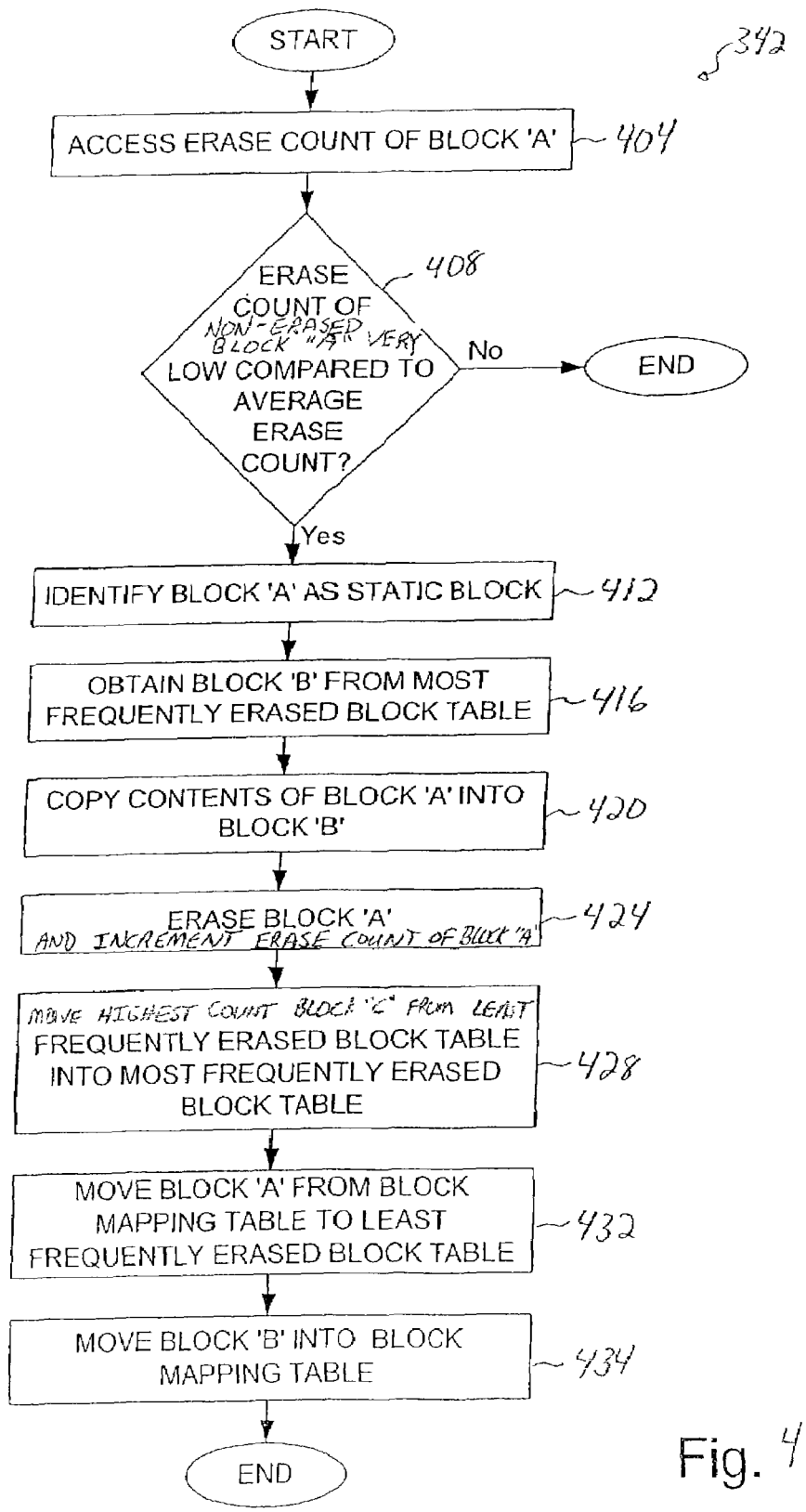
FIG. 4 is a process flow diagram which illustrates the steps associated with one method of processing a static block in accordance with an embodiment of the present invention.

Since a static block contains data that is rarely changed, the data contained in the static block may be copied into a block which has a relatively high erase count. That is, when the contents of a particular physical block are relatively static and, hence, are generally not changed, the contents may effectively be reassigned to a different physical block which has a relatively high erase count in order to enable the original physical block, which has a relatively low erase count, to be used to store contents which are changed more frequently. With reference to FIG. 4, the steps associated with processing a static block, i.e., step 342 of FIG. 3, will be described in accordance with an embodiment of the present invention. A process 342 of processing a static block of a system begins at step 404 in which the erase count of a non-erased block, e.g., block "A," is accessed. Once the erase count of block "A" is accessed, a determination is made in step 408 regarding whether the erase count of a non-erased block "A" is very low compared to the average erase count associated with the system.

Although a determination of whether the erase count of a non-erased block "A" is low compared to the average erase count may be based on substantially any suitable criteria, in one embodiment, the determination is made based on whether the erase count of block "A" has a value that is less than a value associated with a fraction of the average erase count. For example, the erase count of block "A" may be considered to be low when the erase count is less than a predetermined percentage of the average erase count.

If it is determined in step 408 that the erase count of block "A" is not very low compared to the average erase count, then the indication is that block "A" is most likely not a static block. It should be appreciated that while block "A" may still be a static block even if the erase count of block "A" is not considered to be very low, the erase count of block "A" in such a case would effectively not trigger a swap of block "A" with another block. Accordingly, the process of processing a static block is completed.

Alternatively, if it is determined in step 408 that the erase count of block "A" is very low compared to the average erase count, then the implication is that the contents of block "A" may be written into a block with a relatively high erase count such that block "A" with its low erase count may be free to store data that is changed relatively frequently. In other words, the indication when the erase count of block "A" is very low compared to the average erase count is that block "A" is a static block. As such, process flow moves from step 408 to step 412 in which block "A" is identified as a static block. Once block "A" is identified as a static block, a block, namely block "B," may be obtained from a group of most frequently erased blocks as identified by the most frequently erased block table in step 416.

After block "B" is obtained, the contents of block "A" are copied into block "B" in step 420. That is, the user data contained in block "A" is copied into block "B" in step 420. Once the contents of block "A" are copied into block "B," block "A" is erased in step 424. Typically, when block "A" is erased, the erase count associated with block "A" is incremented. A block, e.g., block "C," may be moved from the group of least frequently erased blocks into the group of most frequently erased blocks in step 428 such that the association of block "C" is effectively changed to the most frequently erased block table from the least frequently erased block table. In other words, block "C" is disassociated from the least frequently erased block table and associated with the most frequently erased block table. Such a move allows a space in the least frequently erased block table to effectively be opened up to accommodate block "A," which has a low erase count and, hence, is one of the least frequently erased blocks in the system. Typically, block "C" is the block with the highest erase count in the least frequently erased block table.

Upon moving block "C" out of the group of least frequently erased blocks, or otherwise disassociating block "C" from the least frequently erased block table, process flow moves from step 428 to step 432 in which block "A" is effectively moved from the block mapping table into the least frequently erased block table in step 432. Then, in step 434, block "B," which includes contents that were previously contained in block "A," is associated with the block mapping table. As will be appreciated by those skilled in the art, "moving" block "B" into the block mapping table typically includes updating the mapping of a logical block address that was associated with block "A" to now be associated with block "B." When information pertaining to block "C" is present in the most frequently erased block table, information pertaining to block "B" is present in the block mapping table, and information pertaining to block "A" is present in the least frequently erased block table, the process of processing a static block is completed. It should be understood that process 342 may be repeated until substantially all static blocks associated with a system have been identified and processed.

In general, a block mapping table, a least frequently erased block table, and a most frequently erased block table may be created in system memory, e.g., RAM 112 of FIG. 1a, when an initialization request is sent to an overall flash memory system. To build the tables, space may first be allocated in system memory to accommodate the tables.

Figure 5A:
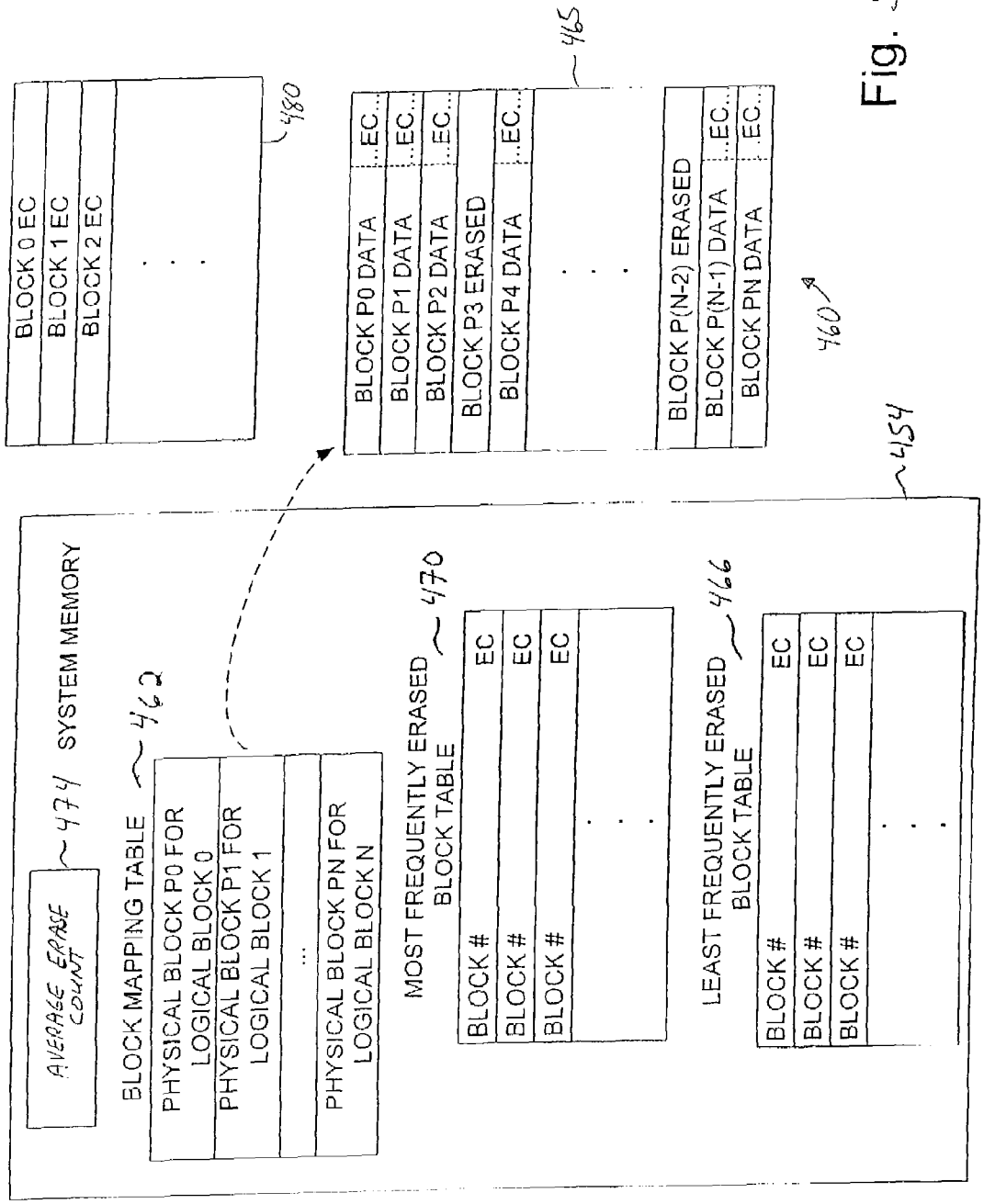
FIG. 5a is a diagrammatic block diagram representation of a system memory in accordance with an embodiment of the present invention.

As mentioned above, a block mapping table, a least frequently erased block table, and a most frequently erased block table are created in system memory, as is an average erase count. An average erase count and the erase count of each block are also written to an erase count block. FIG. 5a is a diagrammatic block diagram representation of a system memory in accordance with an embodiment of the present invention. A system memory 454 and a flash memory 460 are included in an overall system, and may, for example, effectively be components of a memory card or components of a host device in which flash memory 460 such as NAND memory is embedded. System memory 454 is arranged to store a block mapping table 462 with which blocks may be associated. Typically, block mapping table 462 may be used in order to associate LBAs with physical blocks associated with flash memory 460.

System memory 454 also holds a least frequently erased block table 466 and a most frequently erased block table 470 which, like block mapping table 462, are generally formed in response to an initialization request. An average erase count 474, which is arranged to hold the average erase count of blocks within flash memory 460, is created when an overall flash memory system is formatted. In one embodiment, an erase count block 480 is arranged to contain the erase counts of substantially all blocks 465 within flash memory 460. Each time an initialization request is made, an updated average erase count may be calculated, and stored into erase count block 480.

Figure 5B:
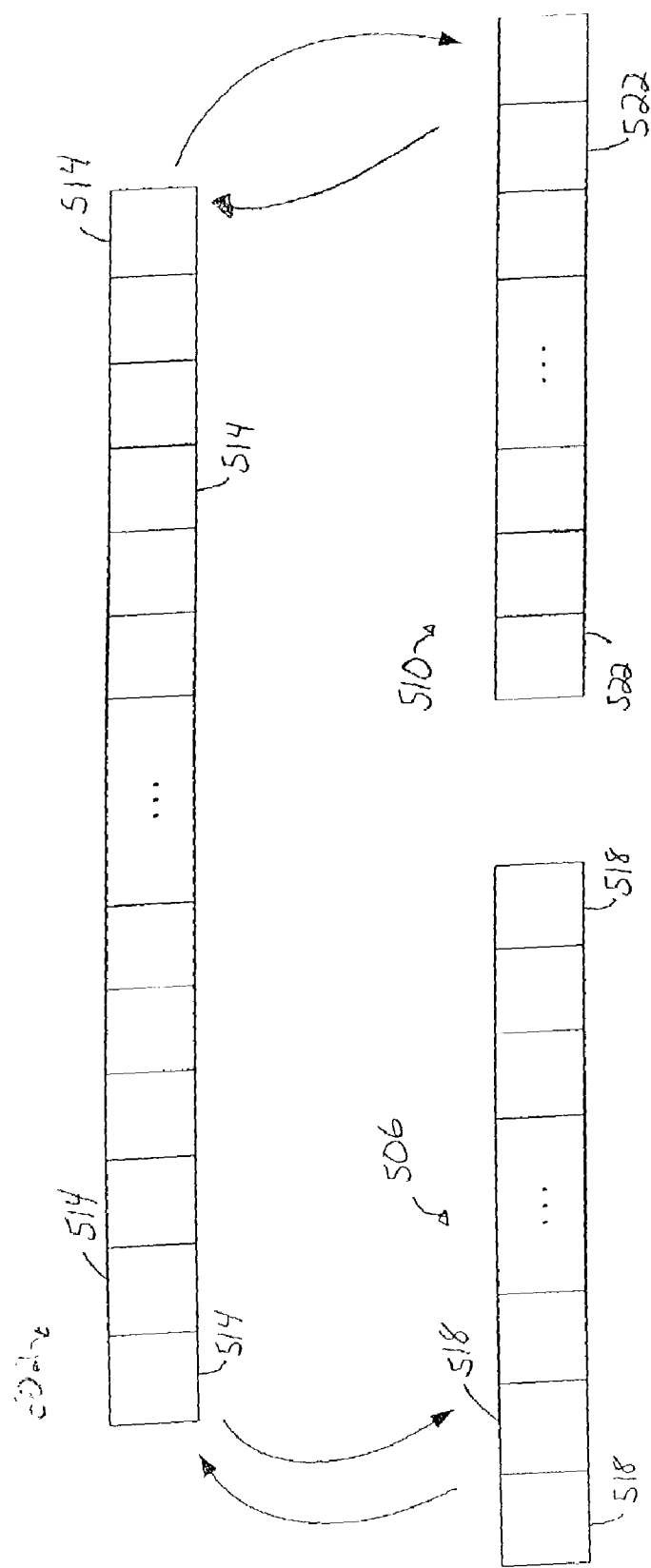
FIG. 5b is a diagrammatic representation of normal blocks, least frequently erased blocks, and most frequently erased blocks in accordance with an embodiment of the present invention.

FIG. 5b is a diagrammatic representation of a group of "normal" blocks, a group of least frequently erased blocks, and a group of most frequently erased blocks in accordance with an embodiment of the present invention. A group of blocks 502 includes blocks 514 which may be normal or static blocks which generally contain user data, or which may be erased may be erased but may not be either a most frequently erased block or a least frequently erased block. A group least frequently erased blocks 506 generally includes blocks 518 which have the lowest erase counts of the erased blocks within an overall system, while a group of most frequently erased blocks 510 generally includes blocks 522 which have the highest erase counts of the erased blocks within the overall system. In general, blocks 518 are effectively used as spare blocks.

When a block 514 is erased, it may be determined whether erased block 514 has a relatively low associated erase count or a relatively high associated erase count. When erased block 514 has a relatively low associated erase count, erased block 514 may be added to group of least frequently erased blocks 506. On the other hand, when erased block 514 has a relatively high associated erase count, erased block 514 may be reassigned to group of most frequently erased blocks 510.

Group of least frequently erased blocks 506, which may be of substantially any size, may be a sorted group. That is, blocks 518 may be substantially sorted based on erase counts. The sorting is typically reflected in a corresponding least frequently erased block table (not shown) which contains entries associated with blocks 518. For instance, each time a new block 518 is moved into or added to, or otherwise associated with, group of least frequently erased blocks 506, blocks 518 may essentially be sorted based on erase counts such that the least frequently erased block 518 in group of least frequently erased blocks 506 may be the next block 518 to be reassigned, as for example to group 502. In other words, when a new block into which data is to be copied is needed, the least erased block 518 of blocks 518 is identified using a least frequently erased block table, and taken from group of least frequently erased blocks 506. Typically, when a block 514 which contains data that is not needed is erased, that block 514 may be stored into group of least frequently erased blocks 506, and the least frequently erased block table may be updated accordingly, i.e., an entry which corresponds to the added block may be included in the least frequently erased block table.

Blocks 522 in group of most frequently erased blocks 510, like blocks 518 stored in group of least frequently erased blocks 506, may also be substantially sorted based on erase counts. The sorting is typically implemented by sorting entries in a most frequently erased block table (not shown) which serves to identify blocks 522. In one embodiment, an average erase count associated with blocks 522 may be calculated, i.e., an average erase count for group of most frequently erased blocks 510 may be determined. When a block 514 from group 502 is erased, and the erase count of the erased block 514 is found to exceed the average erase count for group of most frequently erased blocks 510 by more than a given percentage, e.g., more than approximately twenty percent, the erased block 514 may be added to group of most frequently erased blocks 510. When a new block 522 is effectively added to group of most frequently erased blocks 510, a block 522 within group of frequently erased blocks 510 that has the lowest erase count may be reassigned into group 502. Such reassignments are typically reflected by updating an associated block mapping table, least frequently erased block table, and most frequently erased block table (not shown).

Figure 6:
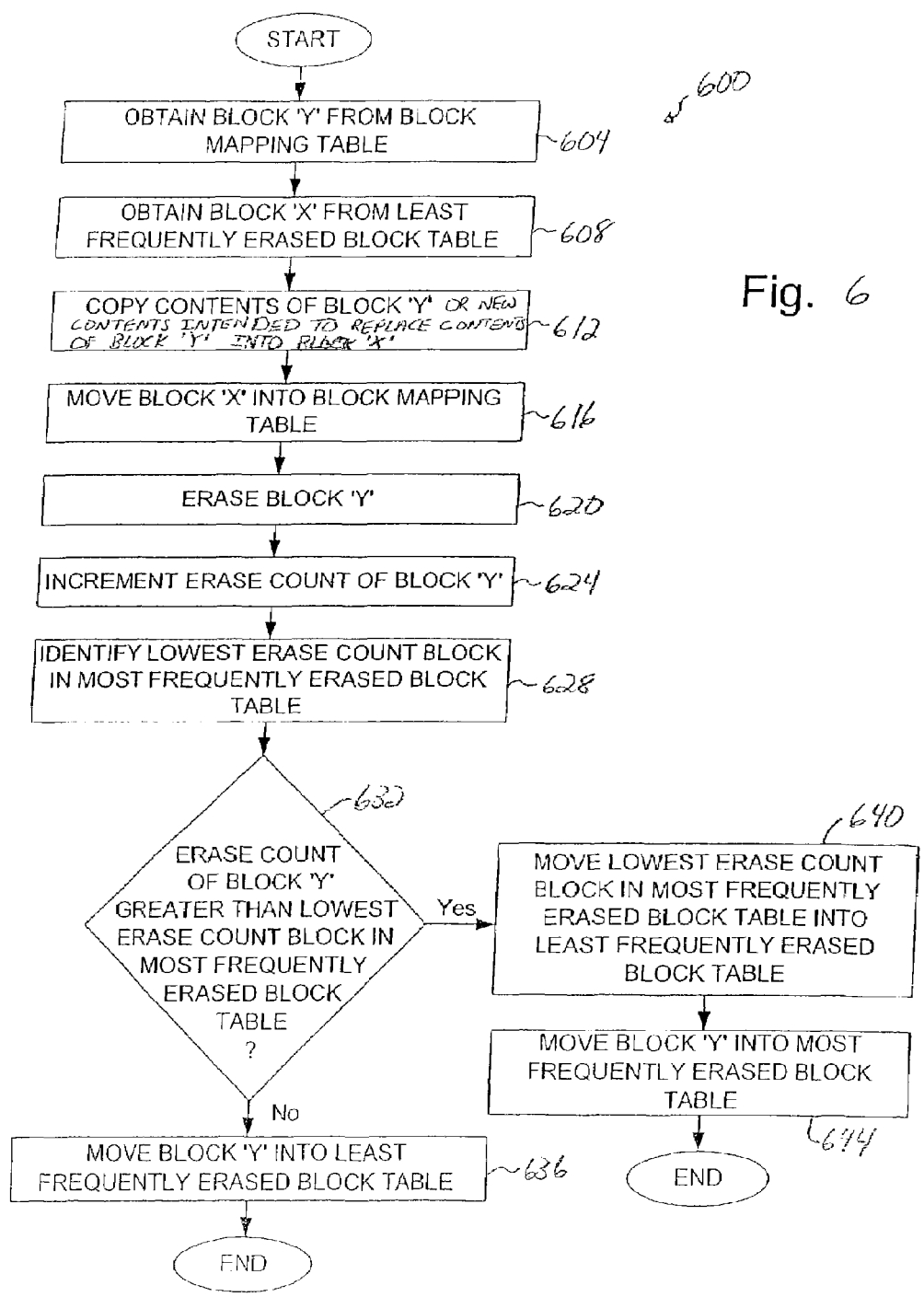
FIG. 6 is a diagrammatic representation of one method of performing a block swap/update in the system memory an overall memory system to allow for more even wear of the blocks in accordance with an embodiment of the present invention.

The swapping or updating of blocks between group 502, group of least frequently erased blocks 506, and most frequently erased blocks 510 may generally occur when a block 514 included in group 502 is to be erased or updated. Alternatively, the swapping or updating of blocks may occur substantially any time it is desired for a spare block to be allocated for use in group 502. Referring next to FIG. 6, one method of performing a block swap or update in an overall memory system such as a host system with embedded flash memory to allow for more even wear of the blocks will be described in accordance with an embodiment of the present invention. A process 600 of performing a block swap or update begins at step 604 in which a block, e.g., block "Y," is "obtained" from a block mapping table or otherwise identified using the block mapping table. The block that is obtained is the block that is to be effectively swapped out of the block mapping table for copying or updating its contents.

Once block "Y" is obtained, a block, e.g., block "X," is effectively obtained in step 608 from the least frequently erased block table. That is, a spare block is obtained from the group of least frequently erased blocks using the least frequently erased block table to identify an appropriate spare block. In general, block "X" is the block with the lowest erase count in the group of least frequently erased blocks, although it should be appreciated that block "X" may be substantially any block associated with the group of least frequently erased blocks and, hence, the least frequently erased block table. The data contents stored in block "Y," or new contents which are to replace the original contents of block "Y," are copied into block "X" in step 612.

After the contents of block "Y" are copied into block "X," block "X" is effectively moved into, or associated with, the block mapping table in step 616. In other words, mappings associated with block "Y" and block "X" are effectively updated such that an LBA which was previously mapped to block "Y" is remapped to block "X." When block "X" is effectively moved into the block mapping table, block "Y" is erased in step 620. Specifically, the data contents, e.g., user contents, stored in block "Y" may be erased using substantially any suitable technique. The erase count associated with block "Y," which is stored in a redundant area associated with block "Y," is then incremented in step 624 to indicate that block "Y" has once again been erased. It should be appreciated that in one embodiment, an erase count for "Y" which is effectively stored in an erase count block may be updated.

In step 628, the block with the lowest erase count in the most frequently erased block table is identified. As described above, in one embodiment, blocks referenced in the most frequently erased block table are sorted according to their respective erase counts. Sorting the blocks may include positioning the references to the blocks within the most frequently erased block table according to the erase counts of the blocks. Hence, identifying the block with the lowest erase count generally involves accessing the block reference in the position within the most frequently erased block table that is arranged to accommodate the block reference with the lowest erase count.

Once the block with the lowest erase count referenced in the most frequently erased block table is identified, process flow moves from step 628 to step 632 in which it is determined if the erase count of block "Y" is greater than the erase count of the block with the lowest erase count referenced in the most frequently erased block table. If it is determined that the erase count of block "Y" is not greater than the erase count of the block with the lowest erase count referenced in the most frequently erased block table, then the indication is that block "Y" is not considered to be frequently erased. Accordingly, process flow proceeds from step 632 to step 636 in which block "Y" is moved into the group of least frequently erased blocks and effectively moved into the least frequently erased block table, i.e., an entry corresponding to block "Y" is added into the least frequently erased block table. It should be appreciated that, in one embodiment, moving block "Y" into the group of least frequently erased blocks may include resorting substantially all block references in the least frequently erased block table using the erase count of each block. After block "Y" is effectively moved into the least frequently erased block table, the process of swapping or updating blocks is completed.

Returning to step 632, if the determination is step 632 is that the erase count of block "Y" exceeds the lowest erase count associated with the most frequently erased block table, the indication is that block "Y" should be moved into the group of most frequently erased blocks and effectively into the most frequently erased block table. In order for there to be room for block "Y" to be referenced in the most frequently erased block table, a block, e.g., the block with the lowest erase count referenced in the most frequently erased block table, effectively needs to be removed from the most frequently erased block table. As such, in step 640, the block with the lowest erase count referenced in the most frequently erased block table is moved into the group of least frequently erased blocks, and effectively moved into the least frequently erased block table. Moving the block into the group of least frequently erased blocks may include resorting the block references in the least frequently erased block table according to the erase count of each block.

After the block with the lowest erase count in the most frequently erased block table is effectively moved out of the most frequently erased block table, block "Y" is effectively moved into the most frequently erased block table in step 644. In one embodiment, moving block "Y" into the group of most frequently erased blocks and, hence, effectively into the most frequently erased block table, may include resorting the most frequently erase blocks according to the erase count of each block, including block "Y." When block "Y" is effectively moved into the most frequently erased block table, the process of swapping or updating blocks is completed.

Figure 7:
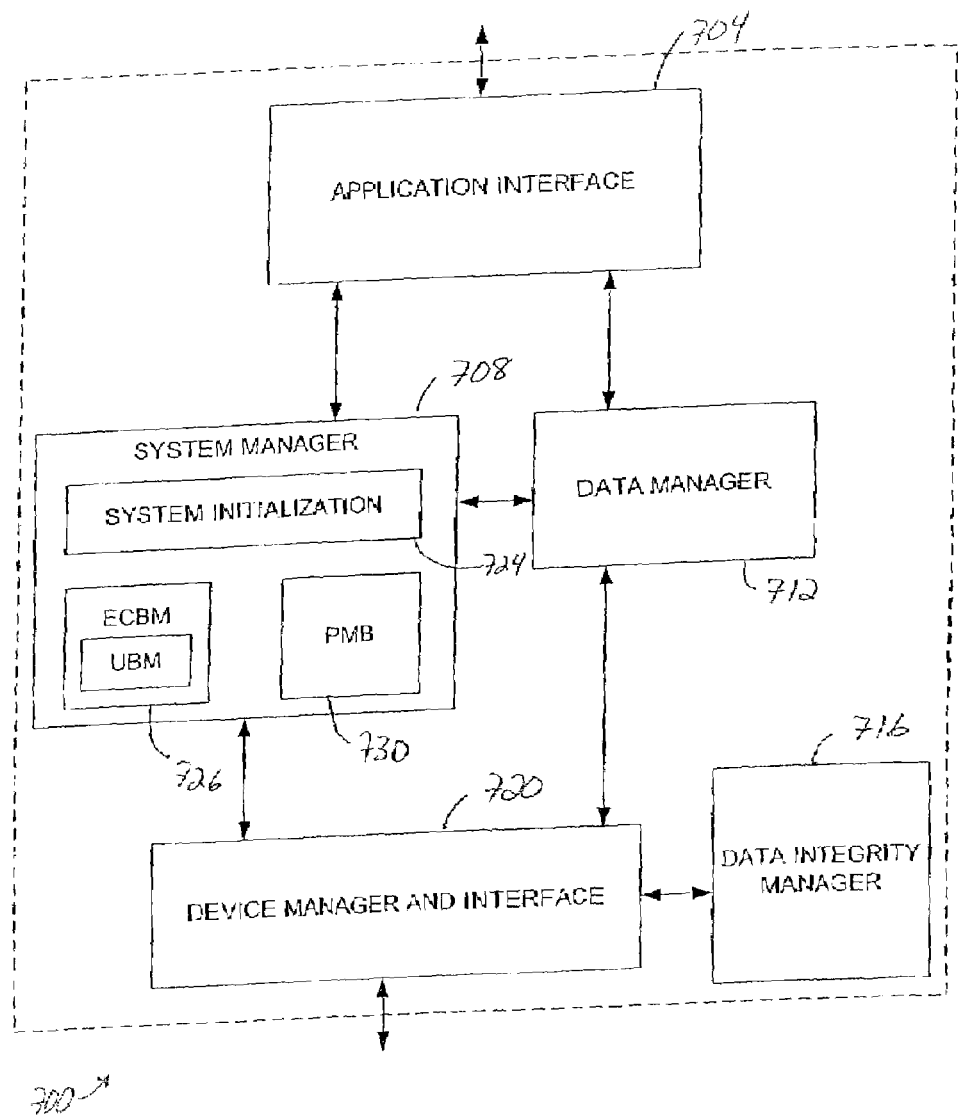
FIG. 7 is a diagrammatic block diagram representation of a system architecture in accordance with an embodiment of the present invention.

In general, the functionality associated with maintaining tables, handling initialization requests, and performing wear leveling, e.g., responding to requests to swap or update blocks, is provided in software, e.g., as program code devices, or as firmware to a host system. One embodiment of a suitable system architecture associated with the software or firmware provided to a host system to enable wear leveling to occur is shown in FIG. 7. A system architecture 700 generally includes a variety of modules which may include, but are not limited to, an application interface module 704, a system manager module 708, a data manager module 712, a data integrity manager 716, and a device manager and interface module 720. In general, system architecture 700 may be implemented using software code devices or firmware which may be accessed by a processor, e.g., processor 108 of FIG. 1a.

In general, application interface module 704 may be arranged to communicate with the host, operating system or the user directly. Application interface module 704 is also in communication with system manager module 708 and data manager module 712. When the user wants to read, write or format a flash memory, the user sends requests to the operating system, the requests are passed to the application interface module 704. Application interface module 704 directs the requests to system manager module 708 or data manager module 712 depending on the requests.

System manager module 708 includes a system initialization submodule 724, an erase count block management submodule 726, and a power management block submodule 730. System initialization submodule 724 is generally arranged to enable an initialization request to be processed, and typically communicates with erase count block management submodule 726. In one embodiment, system initialization submodule 724 allows erase counts of blocks to be updated, and is substantially responsible for creating a least frequently used block table and a most frequently used block table.

Erase count block management submodule 726 includes functionality to cause erase counts of blocks to be stored, and functionality to cause an average erase count to be calculated, as well as updated, using individual erase counts. In other words, erase count block management submodule 726 effectively allows an average erase count to be maintained. Further, in one embodiment, erase count block management submodule 726 also substantially synchronizes the erase count of substantially all blocks in an erase count block during a initialization request of an overall system While erase count block management submodule 726 may be arranged to cause an average erase count to be stored in an erase count block, it should be appreciated that power management block submodule 730 may instead be used to enable the average erase count to be stored.

In addition to being in communication with application interface module 704, system manager module 708 is also in communication with data manager module 712, as well as device manager and interface module 720. Data manager module 712, which communicates with both system manager module 708 and application interface module 704, may include functionality to provide page or block mapping. Data manager module 712 may also include functionality associated with operating system and file system interface layers.

Device manager and interface module 720, which is in communication with system manager module 708, data manager 712, and data integrity manager 716, typically provides a flash memory interface, and includes functionality associated with hardware abstractions, e.g., an I/O interface. Data integrity manager module 716 provides ECC handling, among other functions.

Although only a few embodiments of the present invention have been described, it should be understood that the present invention may be embodied in many other specific forms without departing from the spirit or the scope of the present invention. By way of example, in lieu of assigning blocks to a most frequently erased block table and a least frequently erased block table based on a comparison of each block against an average erase count, blocks may instead be assigned to a most frequently erased block table and a least frequently erased block table based on a substantially absolute determination of which blocks have the highest erase counts and which blocks have the lowest erase counts, respectively. In other words, rather than comparing individual block erase counts against an average erase count, block erase counts may effectively be compared against each other to determine an appropriate table in which to insert a block.

A least frequently erased block table has generally been described as holding references to blocks with a relatively low erase count as spare blocks. Spare blocks are effectively allocated for use through the use of a block mapping table such that substantially any time a spare block is needed, the block with the lowest erase count referenced in the least frequently erased block table is provided for use. In other words, when a block identified in a block mapping table is to be swapped out, a reference to the block with the lowest erase count in the group of least frequently erased blocks is moved into the block mapping table. It should be appreciated, however, that substantially any block may generally be taken from the group of least frequently erased blocks during a block swapping process. Selecting substantially any block from the least frequently erased blocks using the least frequently erased block table to move into the block mapping table may reduce the overhead associated with an overall system, as the blocks within the least frequently erased block table may not necessarily be sorted.

Identifying and processing static blocks generally enhances the ability to enable blocks within an overall memory system to be worn evenly. In one embodiment, however, static blocks are not necessarily identified and processed. For example, if a relatively low number of static blocks is anticipated within a system, the identification and processing of static blocks may be substantially eliminated without departing from the spirit or the scope of the present invention.

While non-volatile memory systems have been described as being controlled by associated memory controllers or being controlled using software or firmware associated with a host system, it should be understood that wear leveling processes which include erase count management may be applied to non-volatile memory systems which are in communication with controllers which are substantially external to the non-volatile memory systems. Suitable memory systems which use controllers include, but are not limited to, PC cards, CompactFlash cards, MultiMedia cards, Secure Digital cards, and embedded chip sets which include flash memory and a flash memory controller. Memory systems which are controlled through the use of software or firmware loaded onto a host system include embedded memory devices. In one embodiment, memory systems which may use the erase management techniques described above and do not use controllers associated with the memory systems may use controllers associated with a host, e.g., a host computer system, to implement wear leveling. That is, a host may directly address and manage memory in which wear leveling is to occur through the use of a controller on the host.

In general, the steps associated with the various processes and methods of wear leveling may vary widely. Steps may generally be added, removed, altered, and reordered without departing from the spirit of the scope of the present invention. By way of example, processing static blocks may not necessarily be included in the processing an initiation request. Also, in one embodiment, the determination of whether to effectively place a newly erased block into a most frequently erased block table may be based upon other criteria in lieu of being based upon whether the erased block has an erase count that is greater than the lowest erase count associated with the most frequently erased block table. For instance, such a determination may be based upon whether the erase count of the erased block exceeds an average erase count of substantially all blocks associated with the most frequently erased block table for a certain percentage, e.g., approximately twenty percent. When the erase count of the erased block exceeds the average erase count by more than the certain percentage, then the block with the lowest erase count referenced in the most frequently erased block table may be moved into a least frequently erased block table, while the erased block is moved into the most frequently erased block table. Therefore, the present examples are to be considered as illustrative and not restrictive, and the invention is not to be limited to the details given herein, but may be modified within the scope of the appended claims.

What is claimed is:

1. A method for allocating non-volatile memory, the non-volatile memory being substantially divided into elements, the method comprising:
grouping the elements into at least a first group, a second group, and a third group, wherein the first group includes erased elements with relatively low wear and the second group includes erased elements with relatively high wear;
determining when a first element included in the third group is to be replaced by a second element included in the first group;
copying contents associated with the first element into the second element obtained from the first group when it is determined that the first element is to be substantially replaced by the second element;
erasing contents of the first element from the first element; and
associating the second element with the third group, wherein associating the second element with the third group includes disassociating the second element from the first group.

2. The method of claim 1 wherein grouping the elements into the first group, the second group, and the third group includes grouping the elements based on an erase count associated with each element.

3. The method of claim 1 wherein the first element includes an erase count, the method further including:
incrementing the erase count of the first element after erasing the contents of the first element.

4. The method of claim 3 further including:
using the erase count of the first element to determine whether to associate the first element with the first group; and
associating the first element with the first group when the erase count of the first element indicates that the first element is to be associated with the first group, wherein associating the first element with the first group includes disassociating the first element from the third group.

5. The method of claim 3 further including:
using the erase count of the first element to determine whether to associate the first element with the second group; and
associating the first element with the second group when the erase count of the first element indicates that the first element is to be associated with the second group, wherein associating the first element with the second group includes disassociating the first element from the third group.

6. The method of claim 5 wherein the elements in the second group have erase counts, the erase counts in the second group including a lowest erase count, the lowest erase count being associated with a third element included in the elements in the second group, and wherein using the erase count of the first element to determine whether to associate the first element with the second group includes determining when the erase count of the first element is greater than the lowest erase count.

7. The method of claim 6 further including:
associating the third element with the first group when the erase count of the first element indicates that the first element is to be associated with the second group, wherein associating the third element with the first group includes disassociating the third element from the second group.

8. The method of claim 1 wherein the non-volatile memory is a NAND flash memory and the elements are blocks.

9. The method of claim 1 wherein the contents associated with the first element are one of the contents of the first element and new contents arranged to replace at least some of the contents of the first element.

10. A method for allocating non-volatile memory, the non-volatile memory being substantially divided into elements, the method comprising:
grouping the elements into at least a first group, a second group, and a third group, wherein the first group includes erased elements with erase counts that are approximately less than an average erase count and the second group includes erased elements with erase counts that are approximately greater than the average erase count;
determining when a first element included in the third group is to be replaced by a second element included in the second group;
copying contents associated with the first element into the second element obtained from the second group when it is determined that the first element is to be substantially replaced by the second element;
erasing contents of the first element from the first element; and
associating the second element with the third group, wherein associating the second element with the third group includes disassociating the second element from the second group.

11. The method of claim 10 wherein the first element is a static element, and determining when the first element included in the third group is to be replaced by the second element included in the second group includes:
determining when a comparison of an erase count associated with the first element to the average erase count indicates that the first element included in the third group is to be replaced by the second element included in the second group.

12. The method of claim 11 wherein determining when the comparison of the erase count associated with the first element to the average erase count indicates that the first element included in the third group is to be replaced by the second element included in the second group includes determining when the erase count associated with the first element is substantially less than the average erase count.

13. The method of claim 10 further including:
associating the first element with the first group, wherein associating the first element with the first group includes disassociating the first element from the third group.

14. The method of claim 10 wherein the non-volatile memory is a NAND flash memory and the elements are blocks.

15. The method of claim 10 wherein the contents associated with the first element are one of the contents of the first element and substantially new contents arranged to replace at least some of the contents of the first element.

16. A memory management system, the memory management system being arranged to non-volatile memory, the non-volatile memory being substantially divided into elements, the memory management system comprising:
- a first manager, the first manager being arranged to group the elements into at least a first group, a second group, and a third group, wherein the first group includes elements with relatively low wear and the second group includes elements with relatively high wear; and
- a second manager, the second manager being arranged to determine when a first element included in the third group is to be replaced by a second element included in the first group, the second manager further being arranged to copy contents associated with the first element into the second element obtained from the first group and to erase contents of the first element from the first element, wherein the second manager is still further arranged to associate the second element with the third group and to disassociating the second element from the first group.

17. The memory management system of claim 16 wherein the first manager is arranged to group the elements into the first group, the second group, and the third group by grouping the elements based on an erase count associated with each element.

18. The memory management system of claim 16 wherein the first element includes an erase count and the second manager is further arranged to increment the erase count of the first element after erasing the contents of the first element from the first element.

19. The memory management system of claim 18 wherein the second manager uses the erase count of the first element to determine whether to associate the first element with the first group and associates the first element with the first group when the erase count of the first element indicates that the first element is to be associated with the first group.

20. The memory management system of claim 18 wherein the second manager is still further arranged to use the erase count of the first element to determine whether to associate the first element with the second group and to associate the first element with the second group when the erase count of the first element indicates that the first element is to be associated with the second group.

21. The memory management system of claim 20 wherein the elements in the second group have erase counts, the erase counts in the second group including a lowest erase count, the lowest erase count being associated with a third element included in the elements in the second group, and wherein the second manager is arranged to use the erase count of the first element to determine whether to associate the first element with the second group by determining when the erase count of the first element is greater than the lowest erase count.

22. The memory management system of claim 16 wherein the non-volatile memory is a NAND flash memory and the elements are blocks.

23. The memory management system of claim 16 wherein the contents associated with the first element are one of the contents of the first element and contents arranged to replace at least some of the contents of the first element.

24. A memory management system for allocating non-volatile memory, the non-volatile memory being substantially divided into elements, the memory management system comprising:
- a first manager, the first manager being arranged to group the erased elements into at least a first group, a second group, and a third group, wherein the first group includes elements with erase counts that are approximately less than an average erase count and the second group includes erased elements with erase counts that are approximately greater than the average erase count; and
- a second manager, the second manager being arranged to determine when a first element included in the third group is to be replaced by a second element included in the second group, the second manager further being arranged to copy contents associated with the first element into the second element obtained from the second group and to erase contents of the first element from the first element, the second manager still further being arranged to associate the second element with the third group and to disassociate the second element from the second group.

25. The memory management system of claim 24 wherein the second manager is arranged to determine when the first element included in the third group is to be replaced by the second element included in the second group by determining when a comparison of an erase count associated with the first element to the average erase count indicates that the first element included in the third group is to be replaced by the second element included in the second group.

26. The memory management system of claim 24 wherein the second manager is arranged to associate the first element with the second group and to disassociate the first element from the third group.

27. The memory management system of claim 24 wherein the non-volatile memory is a NAND flash memory and the elements are blocks.

28. The memory management system of claim 24 wherein the contents associated with the first element are one of the contents of the first element and new contents arranged to replace at least some of the contents of the first element.

29. A method for performing wear leveling in a system which includes a non-volatile memory, the method comprising:
- copying one of contents associated with a first storage element and new contents arranged to replace the contents associated with the first storage element into a second storage element, the second storage element having an erase count that is less than an erase count associated with the first storage element, the second storage element being associated with a first data structure, the first data structure being arranged to contain a first set of storage elements;
- associating the second storage element with a second data structure, the second data structure being arranged to contain a second set of storage elements, wherein associating the second storage element with the second data structure includes disassociating the second storage element from the first data structure;
- erasing the contents associated with the first storage element from the first storage element;
- determining when to associate the first storage element with the first data structure;
- associating the first storage element with the first data structure when it is determined that the first storage element is to be associated with the first data structure, wherein associating the first storage element with the first data structure includes disassociating the first storage element from the second data structure; and
- associating the first storage element with a third data structure when it is determined that the first storage element is not to be associated with the first data structure, the third data structure being arranged to contain a third set of storage elements.

30. The method of claim 29 further including:
determining an average erase count associated with the storage elements, wherein erase counts associated with the storage elements included in the first set of storage elements are substantially lower than the average erase count, erase counts associated with the storage elements included in the third set of storage elements are substantially higher than the average erase count.

31. The method of claim 29 further including:
incrementing the erase count of the first storage element after the contents of the first storage element are erased.

32. The method of claim 31 wherein determining when to associate the first storage element with the first data structure includes:
comparing the erase count of the first storage element to erase counts of storage elements associated with the third set of storage elements.

33. The method of claim 32 wherein when it is determined that the erase count of the first storage element is less than erase counts of storage elements associated with the third set of storage elements, it is determined that the first storage element is to be associated with the first data structure.

34. The method of claim 32 wherein when it is determined that the erase count of the first storage element is greater than at least one erase count of storage elements associated with the third set of storage elements, it is determined that the first storage element is not to be associated with the first data structure.

35. The method of claim 34 wherein associating the first storage element with the third data structure includes:
obtaining a third storage element, the third storage element being associated with the third set of storage elements, the third element having an erase count that is less than the erase count of the first storage element; and
associating the third storage element with the first data structure, wherein associating the third storage element with the first data structure includes disassociating the third storage element from the third data structure.

36. The method of claim 29 further including:
obtaining the first storage element from the second data structure.

37. The method of claim 29 wherein the non-volatile memory is a NAND flash memory.

38. A method for performing wear leveling in a system which includes a non-volatile memory, the method comprising:
copying at least one of contents associated with a first storage element and new contents arranged to replaced the contents associated with the first storage element into a second storage element, the second storage element having an erase count that is greater than an erase count associated with the first storage element, the second storage element being associated with a first data structure, the first data structure being arranged to contain a first set of storage elements;
associating the second storage element with a second data structure, the second data structure being arranged to contain a second set of storage elements, wherein associating the second storage element with the first data structure includes disassociating the second storage element from the first data structure;
erasing the contents associated with the first storage element from the first storage element;
associating the first storage element with a third data structure, the third data structure being arranged to contain a third set of storage elements;
obtaining a third storage element from the third data structure; and
associating the third storage element with the first data structure, wherein associating the third storage element with the first data structure includes disassociating the third storage element from the third data structure.

39. The method of claim 38 wherein the first set of storage elements includes storage elements which each have an erase count that is greater than an average erase count and the third set of storage elements includes storage elements which each have an erase count that is less than the average erase count, and wherein the contents associated with the first storage element are substantially static.

40. The method of claim 38 further including:
comparing the erase count associated with the first storage element with an average erase count associated with the non-volatile memory; and
determining when the erase count associated with the first storage element is substantially less than the average erase count, wherein copying contents associated with the first storage element into the second storage element occurs when it is determined that the erase count associated with the first storage element is substantially less than the average erase count.

41. The method of claim 38 wherein the non-volatile memory is a NAND flash memory.

42. A memory management system, the memory management system being arranged to manage an allocation of non-volatile storage elements, the memory management system comprising:
means for maintaining a first data structure, the first data structure being associated with storage elements which have each been erased substantially less than a particular amount;
means for maintaining a second data structure, the second data structure being associated with storage elements which have each been erased substantially more than a particular amount;
means for maintaining a third data structure, the third data structure being associated with storage elements which are not associated with the first data structure or the second data structure, wherein at least a plurality of the storage elements associated with the third data structure contain data;
means for determining when a first storage element of the third data structure is to be replaced; and
means for associating a second storage element selected from one of the first data structure and the second data structure with the third data structure when it is determined that the first storage element of the third data structure is to be replaced.

43. The memory management system of claim 42 further including:
means for determining the particular amount, wherein the particular amount is an average erase count associated with storage elements of the first data structure, storage elements of the second data structure, and storage elements of the third data structure.

44. The memory management system of claim 43 further including:
means for maintaining the average erase count.

45. The memory management system of claim 44 further including:

means for initializing the first data structure;
means for initializing the second data structure; and
means for initializing the third data structure.

46. The memory management system of claim 44 further including:
means for moving a third storage element of the storage elements which have each been erased substantially less than a particular amount from the first data structure to the second data structure.

47. The memory management system of claim 44 further including:
means for moving a third storage element of the storage elements which have each been erased substantially more than a particular amount from the second data structure to the first data structure.

48. The memory management system of claim 42 further including:
means for copying one of contents of the first storage element and new contents arranged to replace at least some of the contents associated with the first storage element into the second storage element;
means for erasing the first storage element; and
means for incrementing an erase count associated with the first storage element.

49. The memory management system of claim 44 wherein the storage elements are blocks in the non-volatile memory.

50. The memory management system of claim 49 wherein the non-volatile memory is a NAND flash memory.

51. A memory management system, the memory management system being arranged to manage an allocation of non-volatile storage elements, the memory management system comprising:
code devices for copying one of contents associated with a first storage element and new contents arranged to replace the contents associated with the first storage element into a second storage element, the second storage element having an erase count that is less than an erase count associated with the first storage element, the second storage element being associated with a first data structure, the first data structure being arranged to contain a first set of storage elements;
code device for associating the second storage element with a second data structure, the second data structure being arranged to contain a second set of storage elements, wherein the code devices for associating the second storage element with the first data structure include code devices for disassociating the second storage element from the first data structure;
code devices for erasing the contents associated with the first storage element from the first storage element;
code devices for determining when to associate the first storage element with the first data structure;
code devices for associating the first storage element with the first data structure when it is determined that the first storage element is to be associated with the first data structure, wherein the code devices for associating the first storage element with the first data structure include code devices for disassociating the first storage element from the second data structure;
code devices for associating the first storage element with a third data structure when it is determined that the first storage element is not to be associated with the first data structure, the third data structure being arranged to contain a third set of storage elements;
a memory for storing the code devices; and
a processor arranged to access the code devices.

52. The memory management system of claim 51 further including:
code devices for determining an average erase count associated with the storage elements, wherein erase counts associated with the storage elements included in the first set of storage elements are substantially lower than the average erase count, erase counts associated with the storage elements included in the third set of storage elements are substantially higher than the average erase count.

53. The memory management system of claim 51 further including:
code devices for incrementing the erase count of the first storage element after the contents of the first storage element are erased.

54. The memory management system of claim 53 wherein the code devices for determining when to associate the first storage element with the first data structure include:
code devices for comparing the erase count of the first storage element to erase counts of storage elements associated with the third set of storage elements.

55. The memory management system of claim 54 wherein when it is determined that the erase count of the first storage element is less than erase counts of storage elements associated with the third set of storage elements, it is determined that the first storage element is to be associated with the first data structure.

56. The memory management system of claim 54 wherein when it is determined that the erase count of the first storage element is greater than at least one erase count of storage elements associated with the third set of storage elements, it is determined that the first storage element is not to be associated with the first data structure.

57. The memory management system of claim 56 wherein the code devices for associating the first storage element with the third data structure includes:
code devices for obtaining a third storage element, the third storage element being associated with the third set of storage elements, the third element having an erase count that is less than the erase count of the first storage element; and
code devices for associating the third storage element with the first data structure, wherein the code devices for associating the third storage element with the first data structure include code devices for disassociating the third storage element from the third data structure.

58. The memory management system of claim 51 further including:
code devices for obtaining the first storage element from the second data structure.

59. The memory management system of claim 51 wherein the non-volatile memory is a NAND flash memory.

60. A memory management system, the memory management system being arranged to manage an allocation of non-volatile storage elements, the memory management system comprising:
code devices for copying contents associated with a first storage element into a second storage element, the second storage element having an erase count that is greater than an erase count associated with the first storage element, the second storage element being associated with a first data structure, the first data structure being arranged to contain a first set of storage elements;
code devices for associating the second storage element with a second data structure, the second data structure being arranged to contain a second set of storage elements, wherein the code devices for associating the second storage element with the first data structure include code devices for disassociating the second storage element from the first data structure;

code devices for erasing the contents associated with the first storage element from the first storage element;

code devices for associating the first storage element with a third data structure, the third data structure being arranged to contain a third set of storage elements;

code devices for obtaining a third storage element from the third data structure;

code devices for associating the third storage element with the first data structure, wherein the code devices for associating the third storage element with the first data structure include code devices for disassociating the third storage element from the third data structure;

a storage area for storing the code devices; and a processor for accessing the code devices.

61. The memory management system of claim 60 wherein the first set of storage elements includes storage elements which each have an erase count that is greater than an average erase count and the third set of storage elements includes storage elements which each have an erase count that is less than the average erase count, and wherein the contents associated with the first storage element are substantially static.

62. The memory management system of claim 60 further including:

code devices for comparing the erase count associated with the first storage element with an average erase count associated with the non-volatile memory; and code devices for determining when the erase count associated with the first storage element is substantially less than the average erase count, wherein the code devices for copying contents associated with the first storage element include code devices for copying the contents associated with the first storage element into the second storage element when it is determined that the erase count associated with the first storage element is substantially less than the average erase count.

63. The memory management system of claim 60 wherein the non-volatile memory is a NAND flash memory.

64. The memory management system of claim 60 wherein the contents associated with the first element are one of the contents of the first element and substantially new contents arranged to replace at least some of the contents of the first element.

* * * * *